(12) United States Patent
Ni et al.

(10) Patent No.: US 11,569,195 B2
(45) Date of Patent: Jan. 31, 2023

(54) SEMICONDUCTOR PACKAGING STRUCTURE AND METHOD OF FABRICATING SAME

(71) Applicant: Kore Semiconductor Co., Ltd., Qingdao (CN)

(72) Inventors: Ching-Yu Ni, New Taipei (TW); Young-Way Liu, New Taipei (TW)

(73) Assignee: Kore Semiconductor Co., Ltd., Qingdao (CN)

( * ) Notice: Subject to any disclaimer, the term of this patent is extended or adjusted under 35 U.S.C. 154(b) by 0 days.

(21) Appl. No.: 16/448,098

(22) Filed: Jun. 21, 2019

(65) Prior Publication Data

US 2020/0294959 A1    Sep. 17, 2020

(30) Foreign Application Priority Data

Mar. 15, 2019    (CN) .......................... 201910196541.9

(51) Int. Cl.
*H01L 23/00*    (2006.01)
*H01L 21/56*    (2006.01)
(Continued)

(52) U.S. Cl.
CPC .......... *H01L 24/81* (2013.01); *H01L 21/4846* (2013.01); *H01L 21/563* (2013.01);
(Continued)

(58) Field of Classification Search
CPC ......... H01L 24/81; H01L 24/13; H01L 24/16; H01L 21/4846; H01L 21/563; H01L 21/568; H01L 21/6835; H01L 23/3107; H01L 23/498; H01L 24/32; H01L 24/73; H01L 24/92; H01L 23/49541; H01L 2224/13111; H01L 2224/13147; H01L 2224/1601; H01L 2224/16238; H01L 2224/16502; H01L 2224/81005; H01L 2224/81815; H01L 2224/32245; H01L 2221/68345; H01L 2224/73204;
(Continued)

(56) References Cited

U.S. PATENT DOCUMENTS 5,872,393 A * 2/1999 Sakai ................ H01L 23/49894
                                                257/664
8,072,059 B2 * 12/2011 Shim ..................... H01L 21/568
                                                257/698

(Continued)

FOREIGN PATENT DOCUMENTS

CN           102763494 A       10/2012

*Primary Examiner* — Dale E Page
*Assistant Examiner* — Quovaunda Jefferson
(74) *Attorney, Agent, or Firm* — ScienBiziP, P.C.

(57) ABSTRACT

A semiconductor packaging structure manufactured in a manner which does not leave the chip damaged or susceptible to damage upon the removal of temporary manufacturing supports includes at least one electrical conductor, at least one conductive layer, a chip, and a colloid. The chip is spaced from the conductive layer, the electrical conductor is disposed between the conductive layer and the chip and electrically connects the conductive layer to the chip. The colloid covers all outer surfaces of the chip. A method of fabricating such a semiconductor packaging structure is also provided.

7 Claims, 6 Drawing Sheets

(51) Int. Cl.
  *H01L 21/48*     (2006.01)
  *H01L 23/498*    (2006.01)
  *H01L 23/31*     (2006.01)
  *H01L 21/683*    (2006.01)

(52) U.S. Cl.
  CPC ........ *H01L 21/568* (2013.01); *H01L 21/6835* (2013.01); *H01L 23/3107* (2013.01); *H01L 23/498* (2013.01); *H01L 24/13* (2013.01); *H01L 24/16* (2013.01); *H01L 2224/13111* (2013.01); *H01L 2224/13147* (2013.01); *H01L 2224/1601* (2013.01); *H01L 2224/16238* (2013.01); *H01L 2224/16502* (2013.01); *H01L 2224/81005* (2013.01); *H01L 2224/81815* (2013.01)

(58) Field of Classification Search
  CPC . H01L 2224/81193; H01L 2224/81805; H01L 2224/92125; H01L 2224/97
  See application file for complete search history.

(56) References Cited

U.S. PATENT DOCUMENTS

| | | | |
|---|---|---|---|
| 9,230,896 B2 * | 1/2016 | Lee | H01L 24/75 |
| 9,456,500 B2 * | 9/2016 | Gottwald | H05K 1/186 |
| 2008/0241991 A1 | 10/2008 | Poddar et al. | |
| 2011/0049221 A1 * | 3/2011 | Blais | B23K 1/0016 |
| | | | 228/179.1 |
| 2018/0061811 A1 * | 3/2018 | Shen | H01L 25/50 |

* cited by examiner

SEMICONDUCTOR PACKAGING STRUCTURE AND METHOD OF FABRICATING SAME

FIELD

The subject matter herein generally relates to semiconductor packaging.

BACKGROUND

In the existing semiconductor chip packaging process, a temporary glass carrier is used to support and position the semiconductor chip. After the semiconductor chip is packaged, the temporary glass carrier is removed. However, the removal of the temporary glass carrier exposes the back face of the chip and may potentially damage the semiconductor chip or make the semiconductor ship vulnerable to damage.

Therefore, there is room for improvement.

BRIEF DESCRIPTION OF THE DRAWINGS

Implementations of the present technology will now be described, by way of embodiments, with reference to the attached figures.

DETAILED DESCRIPTION

The present disclosure is made in conjunction with the accompanying drawings. Specific embodiments of the present disclosure are described.

In the following description, when an element is described as being "fixed to" another element, the element can be fixed to the another element with or without intermediate elements. When an element is described as "connecting" another element, the element can be connected to the other element with or without intermediate elements.

Without a given definition otherwise, all terms used have the same meaning as commonly understood by those skilled in the art. The term "and/or" means including any and all combinations of one or more of associated listed items. The terms "vertical", "horizontal" and similar expressions used herein are for illustrative purposes only.

Figure 1:
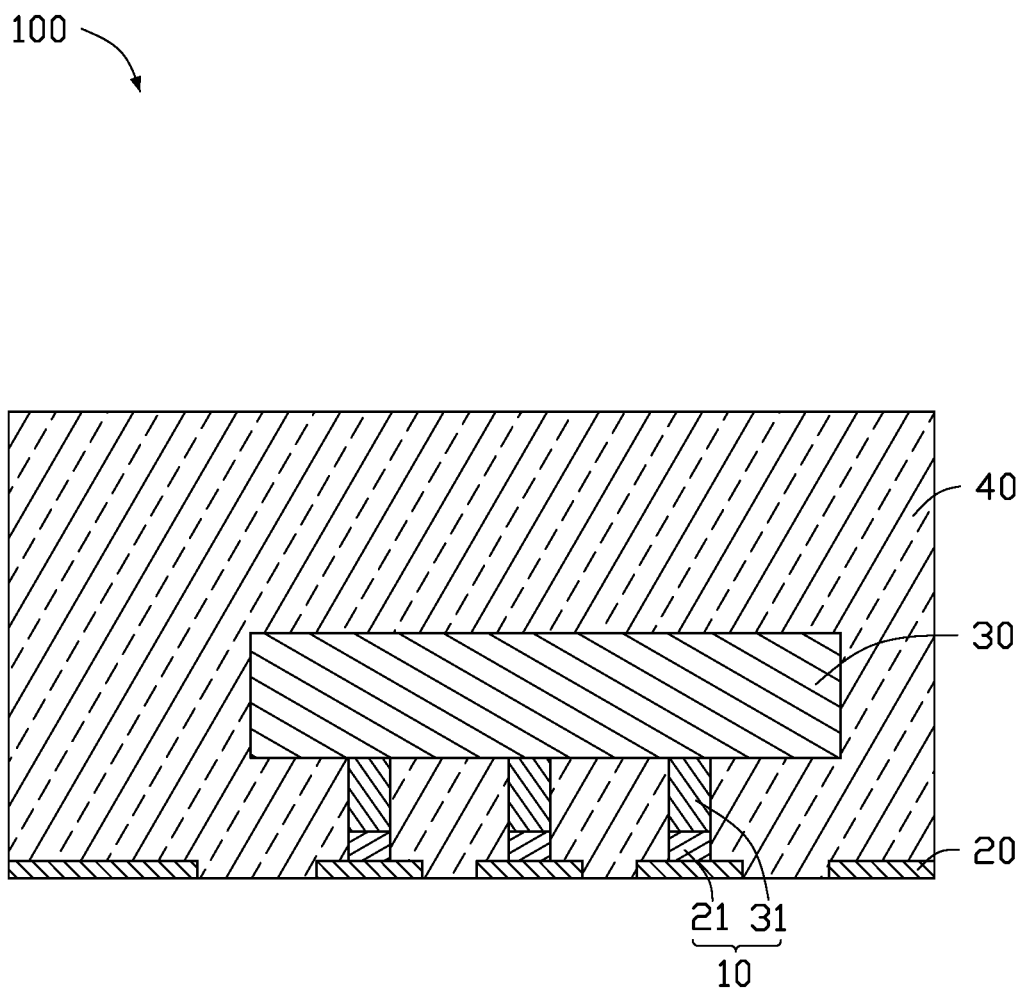
FIG. 1 is a schematic cross-sectional view of a semiconductor packaging structure provided by the present disclosure.

Referring to FIG. 1, a semiconductor packaging structure 100 includes at least one electrical conductor 10, at least one conductive layer 20, a chip 30, and a colloid or sealant 40. The chip 30 is spaced from the conductive layer 20. The electrical conductor 10 is disposed between the conductive layer 20 and the chip 30 and electrically connects the conductive layer 20 to the chip 30. The colloid 40 covers the outer surfaces of the chip 30. A height of the electrical conductor 10 extended from the chip 30 to the conductive layer 20 is greater than 40 μm, thereby the chip 30 is spaced more than 40 μm from the conductive layer 20. The colloid 40 fills gaps formed between the conductive layer 20 and the chip 30 and prevents the chip 30 being damaged or open to damage by being exposed.

The electrical conductor 10 includes a copper-tin eutectic layer (not shown), which reduces a temperature for forming the electrical conductor 10 and increases the stability of microstructures of the electrical conductor 10.

Referring to FIG. 2A to FIG. 2E, a method of manufacturing the semiconductor packaging structure 100 includes the following steps.

Figure 2A:
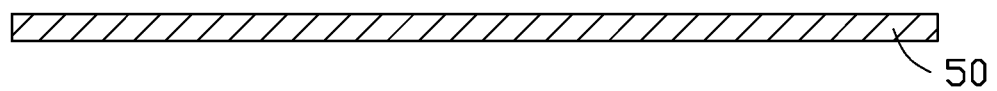
FIG. 2A is a schematic cross-sectional view of a substrate for forming the structure of FIG. 1.
Figure 2B:
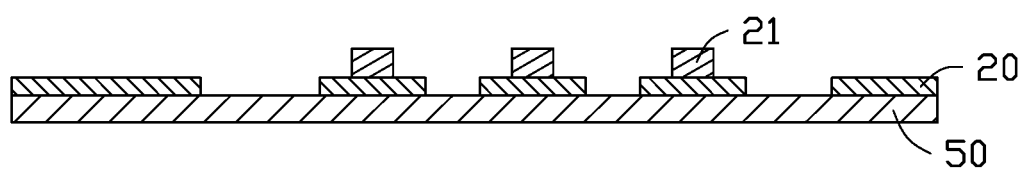
FIG. 2B is a schematic cross-sectional view of a first temporary carrier obtained by forming a conductive layer on the substrate of FIG. 2A.
Figure 2C:
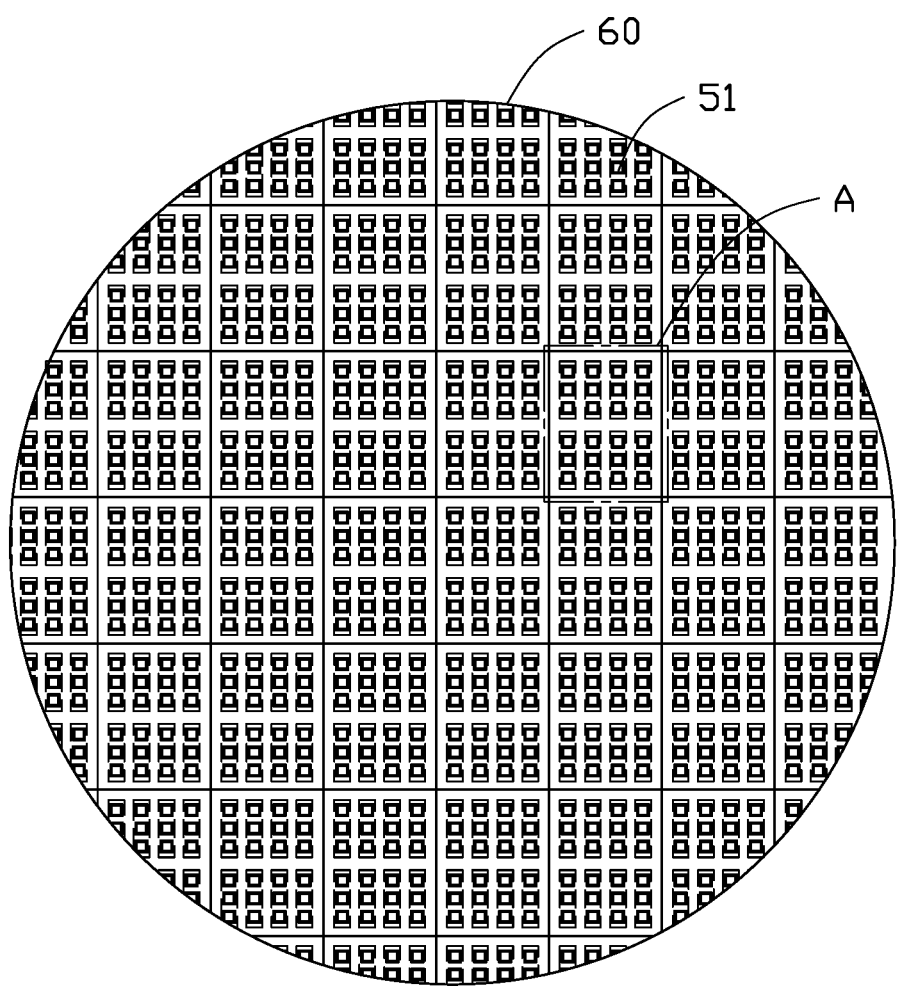
FIG. 2C is a top plan view of the first temporary carrier of FIG. 2B.

In step S1, as shown in FIG. 2A, a substrate 50 including a plurality of region units 51 (as shown in FIG. 2C) is provided.

In step S2, as shown in FIGS. 2B and 2C, a conductive layer 20 is formed on each of the region units 51 to produce a first temporary carrier 60.

Figure 2D:
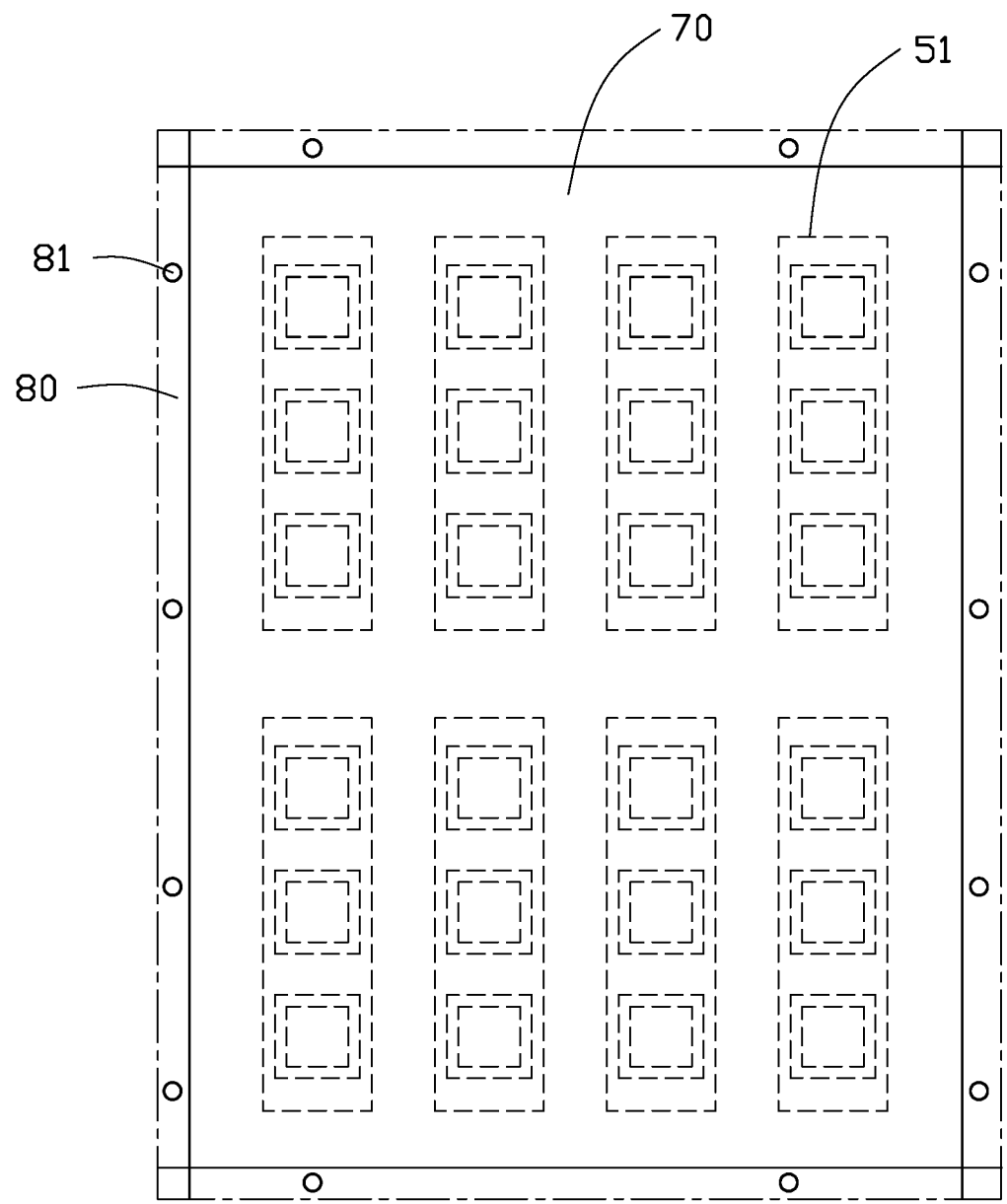
FIG. 2D is a top plan view of a second temporary carrier obtained by splitting the first temporary carrier of FIG. 2B.

In step S3, as shown in FIG. 2D, the first temporary carrier 60 is cut and divided to form a plurality of second temporary carriers 70. Each of the second temporary carriers 70 includes at least one of the unit region 51 covered with the conductive layer 20.

Figure 2E:
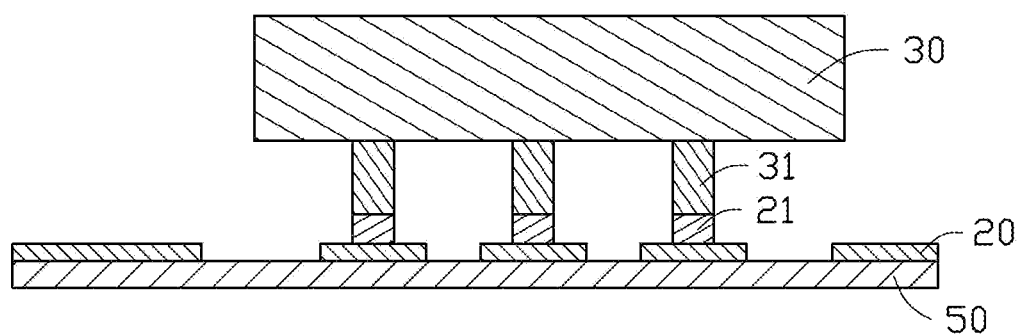
FIG. 2E is a schematic view of a chip soldered on the second temporary carrier of FIG. 2D.

In step S4, as shown in FIG. 2D, a metal frame 80 wraps the periphery of each of the second temporary carriers 70. The metal frame 80 is defined with a plurality of fixing holes 81 through which the second temporary carrier 70 is fixed on a staging (not shown);

In step S5, as shown in FIG. 2E, a chip 30 is soldered on each of the conductive layers 20. The solder between the chip 30 and the conductive layer 20 forms an electrical conductor 10 and spaces the chip 30 from the conductive layer 20.

In step S6, as shown in FIG. 1, the chip 30 is packaged by a colloid 40 and the colloid 40 covers all outer surfaces of the chip 30 to produce an intermediate product (not shown). The intermediate product includes the colloid 40, the chip 30, the conductive layer 20, and the conductor 10.

In step S7, as shown in FIG. 1, the intermediate product is separated from the substrate 50 to obtain the semiconductor packaging structure 100. In this step, the metal frame 80 is also separated from the intermediate product and retained by the substrate 50.

In the embodiment, each of the region units 51 forms a semiconductor packaging structure 100. A total area of all the region units 51 is smaller than an area of the substrate 50. The area of each region unit 51 is slightly larger than the area of a chip 30.

The material of the substrate 50 can be any insulating hard material of sufficient strength to provide support. In the embodiment, the material of the substrate 50 is glass. In other embodiments, the material of the substrate 50 can be polyimide (PI), polyethylene terephthalate (PET), polyethylene naphthalate (Polyethylene Naphthalate, PEN), or any other resinous hard material.

In the embodiment, the conductive layer 20 is a copper foil for adherence to a region unit 51. In another embodiment, the conductive layer 20 can be sputtered, plated, or etched on the region unit 51.

In another embodiment, the conductive layer 20 can be a redistribution layer, and the conductive layer 20 can be a single-layer or multi-layer metal composite structure. For example, the conductive layer can be a single-layer or multi-layer metal composite structure, made of gold, nickel, and copper. In the embodiment, the first temporary carrier 60 is cut and divided into a plurality of second temporary carriers 70 by laser cutting technology. Each second temporary carrier 70 may include a plurality of region units 51.

The use of second temporary carriers 70 rather than the larger first temporary carrier 60 to fabricate semiconductor packaging structures 100 reduces the number of semiconductor packaging structures 100 being scrapped because of breakage of the first temporary carrier 60.

In the embodiment, the conductive layer 20 and the chip 30 are soldered by reflow soldering. As shown in FIG. 2B, before the conductive layer 20 is soldered to the chip 30, at least one pin 21 is disposed on the conductive layer 20 and at least one protrusion 31 is disposed on the chip 30 corresponding to the pin 21. The pin 21 can be made of copper and the protrusion 31 can be made of tin. The pin 21 and the protrusion 31 are soldered by reflow soldering to form the electric conductor 10. The electric conductor 10 forms a copper and tin eutectic layer at the point where the protrusion 31 contacts the pin 21. The height of the electrical conductor 10 extended from the conductive layer 20 to the chip 30 is greater than 40 μm.

In the embodiment, the colloid 40 is formed by injection molding. The injection molding process can be, firstly, a mold including a cavity and a glue injection channel is provided. Then the second temporary carrier 70, the conductive layer 20, and the chip 30 on the second temporary carrier 70 are received in the cavity. Glue is injected into the cavity through the injection channel to cover the chip 30 and fill gaps between the conductive layer 20 and the chip 30. Finally, the glue is solidified to form the colloid 40, as the intermediate product is formed and taken out from the mold.

The embodiments of the present disclosure provide a conductive layer on a temporary carrier, and electrically connects the conductive layer and the chip through a conductor having a preset height. A gap thereby exists between the chip and the conductive layer, and the colloid covers all outer surfaces of the chip, thereby avoiding chip breakage.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims.

What is claimed is:

1. A method of fabricating a semiconductor packaging structure, comprising the steps of providing a substrate comprising a plurality of region units;

forming a conductive layer on each of the region units to produce a first temporary carrier;

cutting and dividing the first temporary carrier to a plurality of second temporary carriers, each of the second temporary carriers comprising a plurality of the region units formed with the conductive layer;

wrapping a metal frame on a periphery of the substrate of the second temporary carrier, the metal frame defining a plurality of fixing holes;

fixing the metal frame to a staging through the fixing hole;

soldering a chip on the conductive layer of at least one of the second temporary carriers, the soldering forming at least one electrical conductor between the chip and the conductive layer, the electrical conductor spacing the chip from the conductive layer thereby forming gaps between the chip and the conductive layer;

injecting glue to cover the chip and fill the gaps between the conductive layer and the chip to [package] the chip to form a colloid covering the chip, the colloid covering all outer surfaces of the chip to produce an intermediate product comprising the colloid, the chip, the conductive layer and the electrical conductor, wherein the colloid covers the chip and fills gaps between the conductive layer and the chip; and separating the intermediate product from the substrate of the second temporary carrier and the metal frame to obtain the semiconductor packaging structure, wherein the metal frame fixed to the staging is retained by the substrate of the second temporary carrier.

2. The method according to claim 1, wherein the conductive layer is formed on the substrate by one of bonding, sputtering, and plating.

3. The method according to claim 1, wherein the conductive layer is adhered on the substrate.

4. The method according to claim 1, wherein at least one pin is disposed on the conductive layer and at least one protrusion is disposed on the chip corresponding to the pin, the pin and the protrusion are soldered by reflow soldering to form the electric conductor.

5. The method according to claim 4, wherein a height of the electric conductor extended from the conductive layer to the chip is greater than 40 μm.

6. The method according to claim 4, wherein a material of the pin is made of one of copper or tin, and a material of the protrusion is made of another of the copper or tin, the electrical conductor forms a copper-tin eutectic layer at the point where the protrusion contacts the pin.

7. The method according to claim 1, wherein the colloid is formed by injection molding.

\* \* \* \* \*